(12) United States Patent
Ahmed et al.

(10) Patent No.: US 9,245,743 B2
(45) Date of Patent: Jan. 26, 2016

(54) METHODS FOR FORMING HIGH-K DIELECTRICS CONTAINING HAFNIUM AND ZIRCONIUM USING ATOMIC LAYER DEPOSITION

(71) Applicant: Intermolecular Inc., San Jose, CA (US)

(72) Inventors: Khaled Ahmed, Anaheim, CA (US); Frank Greer, Pasadena, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 14/109,728

(22) Filed: Dec. 17, 2013

(65) Prior Publication Data

US 2015/0035085 A1 Feb. 5, 2015

Related U.S. Application Data

(60) Provisional application No. 61/861,510, filed on Aug. 2, 2013.

(51) Int. Cl.
*H01L 21/02* (2006.01)
*H01L 29/51* (2006.01)
*H01L 21/28* (2006.01)
*C23C 16/40* (2006.01)
*C23C 16/455* (2006.01)

(52) U.S. Cl.
CPC ........ *H01L 21/02181* (2013.01); *C23C 16/405* (2013.01); *C23C 16/45531* (2013.01); *H01L 21/0228* (2013.01); *H01L 21/02189* (2013.01); *H01L 21/02194* (2013.01); *H01L 21/28194* (2013.01); *H01L 29/513* (2013.01); *H01L 29/517* (2013.01)

(58) Field of Classification Search
None
See application file for complete search history.

(56) References Cited

U.S. PATENT DOCUMENTS

| 7,217,643 | B2 | 5/2007 | Liang | |
|---|---|---|---|---|
| 8,278,184 | B1 | 10/2012 | Chen | |
| 8,288,241 | B2 | 10/2012 | Hirota | |
| 8,324,118 | B2 | 12/2012 | Liu | |
| 8,440,537 | B1 | 5/2013 | Malhotra | |
| 2008/0233288 | A1* | 9/2008 | Clark | 427/255.394 |
| 2012/0261770 | A1 | 10/2012 | Lin | |

OTHER PUBLICATIONS

Triyoso, D.H., in "Impact of Post Deposition Annealing on Characteristics of HfxZr1-xO2," (2009) Mater. Res. Soc. Symp. Proc. vol. 1155, p. 1155-007-05 (6 pages).*
Triyoso, D.H, in "Characteristics of atomic-layer-deposited thin HfxZr1-xO2 gate dielectrics," (2007) Journal of Vacuum Science & Technology B 25, 845, pp. 845-852.*
R. I. Hedge, et al.; Hafnium Zirconate Gate Dielectric for Advanced Gate Stack Applications; Apr. 13, 2007; AIP Applied Physics Letter; Unknown.

* cited by examiner

*Primary Examiner* — Michael Jung

(57) ABSTRACT

Embodiments provided herein describe high-k dielectric layers and methods for forming high-k dielectric layers. A substrate is provided. The substrate includes a semiconductor material. The substrate is exposed to a hafnium precursor. The substrate is exposed to a zirconium precursor. The substrate is exposed to an oxidant only after the exposing of the substrate to the hafnium precursor and the exposing of the substrate to the zirconium precursor. The exposing of the substrate to the hafnium precursor, the exposing of the substrate to the zirconium precursor, and the exposing of the substrate to the oxidant causes a layer to be formed over the substrate. The layer includes hafnium, zirconium, and oxygen.

11 Claims, 8 Drawing Sheets

METHODS FOR FORMING HIGH-K DIELECTRICS CONTAINING HAFNIUM AND ZIRCONIUM USING ATOMIC LAYER DEPOSITION

CROSS-REFERENCE TO RELATED APPLICATION

This application claims priority to U.S. Provisional Patent Application No. 61/861,510, filed Aug. 2, 2013, entitled "Scaled and Reliable Gate Stack for MOSFETs," which is incorporated by reference herein in its entirety for all purposes.

TECHNICAL FIELD

The present invention relates to high-k dielectrics. More particularly, this invention relates to doped high-k dielectrics and methods for forming such high-k dielectrics.

BACKGROUND OF THE INVENTION

The use of high dielectric constant materials (i.e., high-k dielectrics) in gate dielectrics (or other dielectric layers) in semiconductors devices, such as metal-oxide-semiconductor field-effect transistors (MOSFETs), has allowed microelectronic components to be further miniaturized in recent years.

It has been shown that the addition of zirconium (e.g., zirconium oxide) to an otherwise hafnium oxide gate dielectric (or gate stack) improves both negative-bias temperature instability (NBTI) and positive-bias temperature instability (PBTI).

However, prior art attempts incorporate relatively high amounts of zirconium oxide (e.g., 60%), resulting in increased gate leakage, which is particularly undesirable for low power applications.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims, and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Embodiments described herein provide improved high-k dielectrics for use with, for example, metal-oxide-semiconductor field-effect transistors (MOSFETs). In some embodiments, the high-k dielectric includes hafnium, zirconium, and oxygen, such as in the form of zirconium-doped hafnium oxide. In some embodiments, a small amount (e.g., 3-10%) of zirconium (or zirconium oxide) is incorporated into the dielectric. In some embodiments, this is accomplished using a vapor deposition process, such as atomic layer deposition (ALD), in which each reaction/growth cycle includes a hafnium precursor pulse and a zirconium precursor pulse followed by exposure to an oxidant. That is, within each cycle, the oxidant is introduced only after the substrate has been exposed to both the hafnium precursor and the zirconium precursor.

In embodiments utilizing ALD, the result is that each "mono-layer" formed includes both hafnium oxide and zirconium oxide. That is, some of the sites (or vacancies) on the exposed surface are occupied with hafnium oxide molecules, while others are occupied by zirconium oxide molecules. In an embodiment in which the hafnium precursor (e.g., TDMAHf) is introduced first, each mono-layer (and/or the dielectric layer formed by multiple cycles) includes between about 3% and about 10% zirconium, preferably less than about 5% zirconium.

Figure 1:
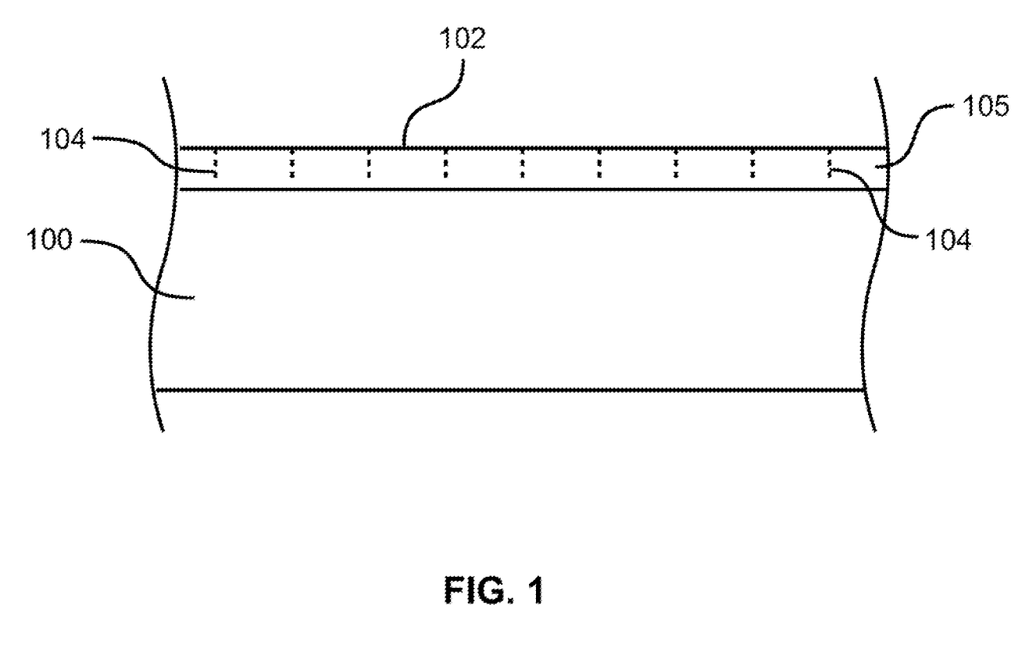
FIG. 1 is a cross-sectional side view of a substrate according to some embodiments.

FIGS. 1-5 illustrate a method for forming a high-k dielectric layer according to some embodiments. Referring to FIG. 1, a substrate 100 is provided. In some embodiments, the substrate 100 includes (or is made of) a semiconductor material, such as silicon, germanium, a "III-V" semiconductor material (e.g., gallium arsenide), or a combination thereof. The substrate 100 has an upper surface 102 which may be understood to having a plurality of surface sites, or vacancies, 104 thereon. As shown in FIG. 1 (as well as FIGS. 2 and 3), in some embodiments, a dielectric layer 105 is formed (e.g., using chemical vapor deposition (CVD)) above the substrate 100. The dielectric layer may, for example, be made of silicon oxide (e.g., SiO or $SiO_2$) and have a thickness of between about 0.1 nanometers (nm) and about 7 nm. The dielectric layer 105 may be considered to form a part of the substrate 100 such that an upper surface of the dielectric layer 105 forms the upper surface 102 of the substrate 100.

Figure 2:
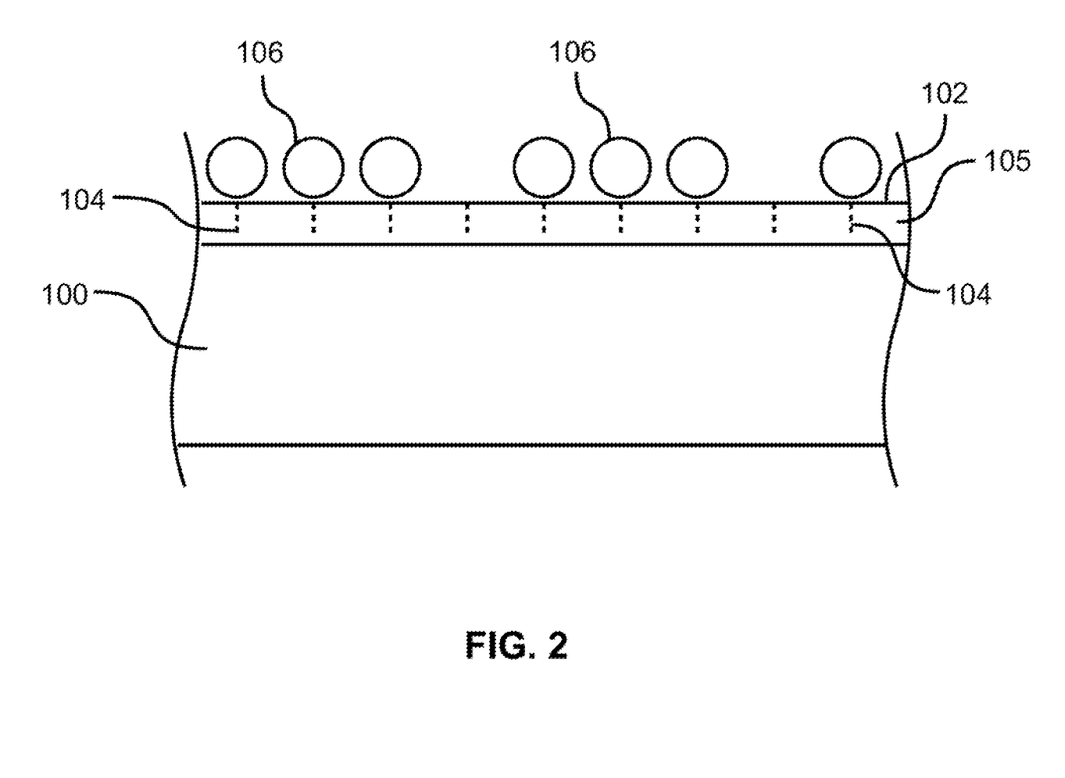
FIG. 2 is a cross-sectional view of the substrate of FIG. 1 after being exposed to a first precursor.

Referring to FIGS. 2-5, a high-k dielectric layer is then formed above the substrate 100 (and/or the upper surface 102 thereof) using a CVD process, such as ALD. Referring specifically to FIG. 2, the substrate 100 (and/or the dielectric layer 105) is first exposed to a first precursor (or reagent) (or a "pulse" of a first precursor is applied). In some embodiments, the first precursor is a hafnium precursor, such as tetrakisdimethyl amido hafnium (TDMAHf), tetrakis-diethyl amido hafnium (TDEAHf), hafnium tert-butoxide, and/or hafnium chloride. However, in some embodiments, the first precursor is a zirconium precursor, such as tetrakis-diethyl amido zirconium (TDEAZr).

Still referring to FIG. 2, as a result, atoms 106 of the first precursor (e.g., hafnium atoms) bond to respective sites 104 on the upper surface 102 of the substrate 100 (or the dielectric layer 105). However, it should be noted that not all of the sites 104 are occupied, as one skilled in the art will appreciate when considering processes such as ALD. After the exposure to the first precursor, the substrate 100 may be exposed to a purge gas, such as nitrogen or argon. In some embodiments, the exposure to the first precursor (and the subsequent purge) may be repeated multiple times, with each exposure resulting in a greater number of sites 104 being occupied by one of the first precursor atoms 106. However, as will be appreciated by one skilled in the art, at least some of the sites 104 will remain vacant (i.e., complete saturation will not be achieved).

Figure 3:
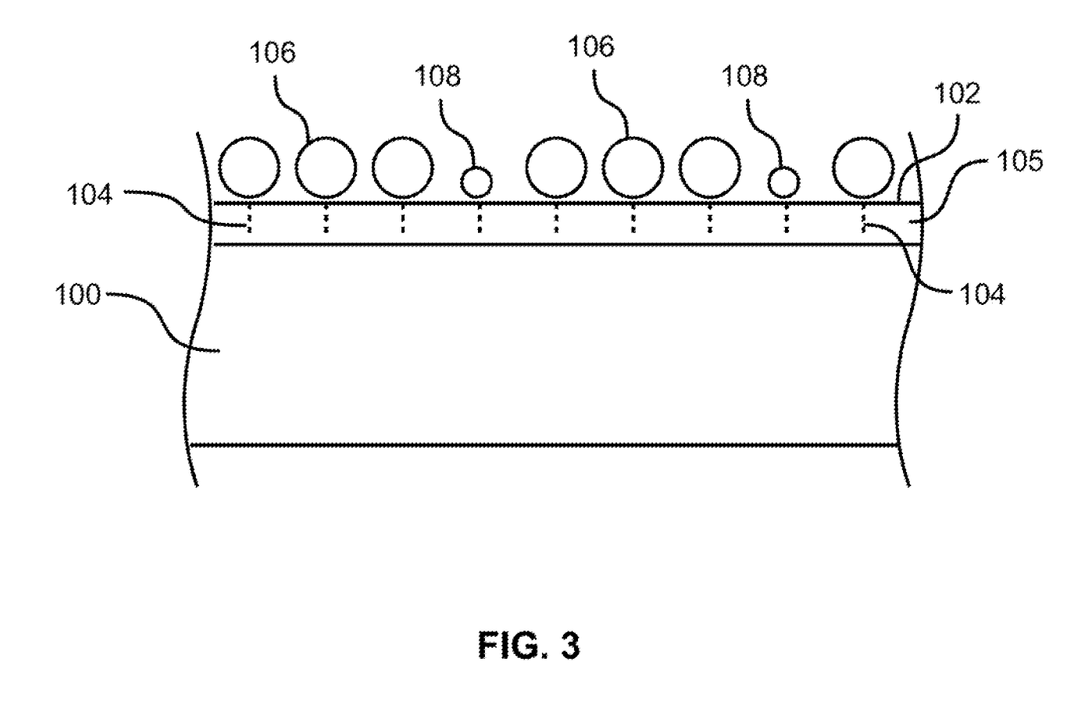
FIG. 3 is a cross-sectional view of the substrate of FIG. 2 after being exposed to a second precursor.

Referring to FIG. 3, after the exposure(s) to the first precursor (and associated purges), the substrate 100 is exposed to a second precursor (or reagent) (or a pulse of a second precursor is applied). In embodiments in which the first precursor is a hafnium precursor, the second precursor is a zirconium precursor, and vice versa.

The exposure of the substrate 100 to the second precursor causes atoms 108 of the second precursor to bond to (at least some of) the vacant surface sites 104. As with the first precursor, after the exposure to the second precursor, the substrate 100 may be exposed to a purge gas, and this process (i.e., exposure to second precursor and purge) may be repeated to minimize the number of sites 104 which may remain vacant.

Figure 4:
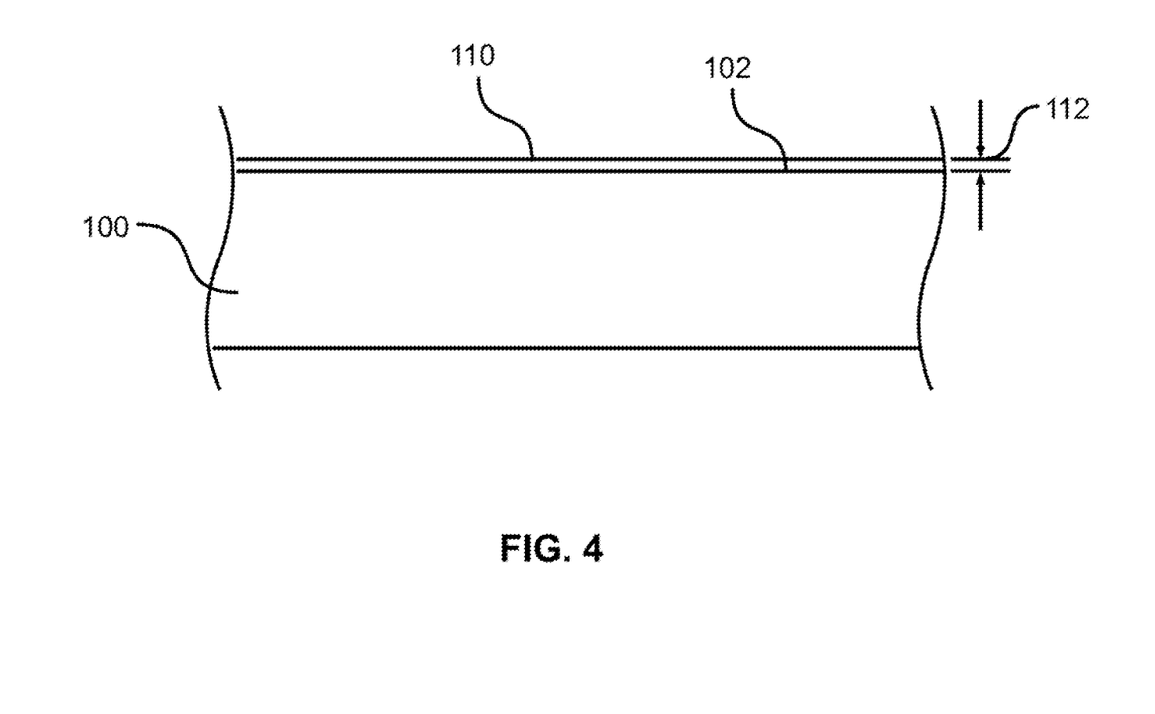
FIG. 4 is a cross-sectional view of the substrate of FIG. 3 after being exposed to an oxidant and an oxide-monolayer has been formed thereon.

Referring now to FIGS. 3 and 4, the substrate 100 is then exposed to an oxidant (or oxidizing reagent), such as water vapor, causing a layer to be formed above the substrate that includes hathium, zirconium, and oxygen. It should be noted that the substrate 100 is exposed to the oxidant only after being exposed to both the first precursor and the second precursor (and associated purges).

The exposure to the oxidant causes the atoms 106 and 108 to be oxidized, thus forming an oxide mono-layer 110 (i.e., formed of a single layer of oxide molecules) above the substrate 100. As will be appreciated by one skilled in the art, the mono-layer 110 may have a thickness of, for example, between about 0.5 Angstroms (Å) and 1.0 Å. The process described above (i.e., exposure to the first precursor and the second precursor followed by the oxidant) may be referred to as a single growth or reaction cycle (e.g., a single ALD growth cycle).

In embodiments in which the first precursor is a hafnium precursor and the second precursor is a zirconium precursor, the oxide mono-layer 110 may be considered to be made of zirconium-doped hafnium oxide. In such embodiments, the mono-layer 110 may include between about 3% and about 10%, preferably less than about 5%, zirconium oxide. As alluded to above, the amount of zirconium oxide in the mono-layer 110 may be reduced by increasing the number of exposures to/pulses of the hafnium precursor before the exposures to/pulses of the zirconium precursor.

In embodiments in which the first precursor is a zirconium precursor and the second precursor is a hafnium precursor, the oxide mono-layer 110 may be considered to be made of hafnium-doped zirconium oxide. In such embodiments, the mono-layer 110 may include between about 3% and about 10%, preferably less than about 5%, hafnium oxide. In such embodiments, the amount of hafnium oxide in the mono-layer 110 may be reduced by increasing the number of exposures to/pulses of the zirconium precursor.

Figure 5:
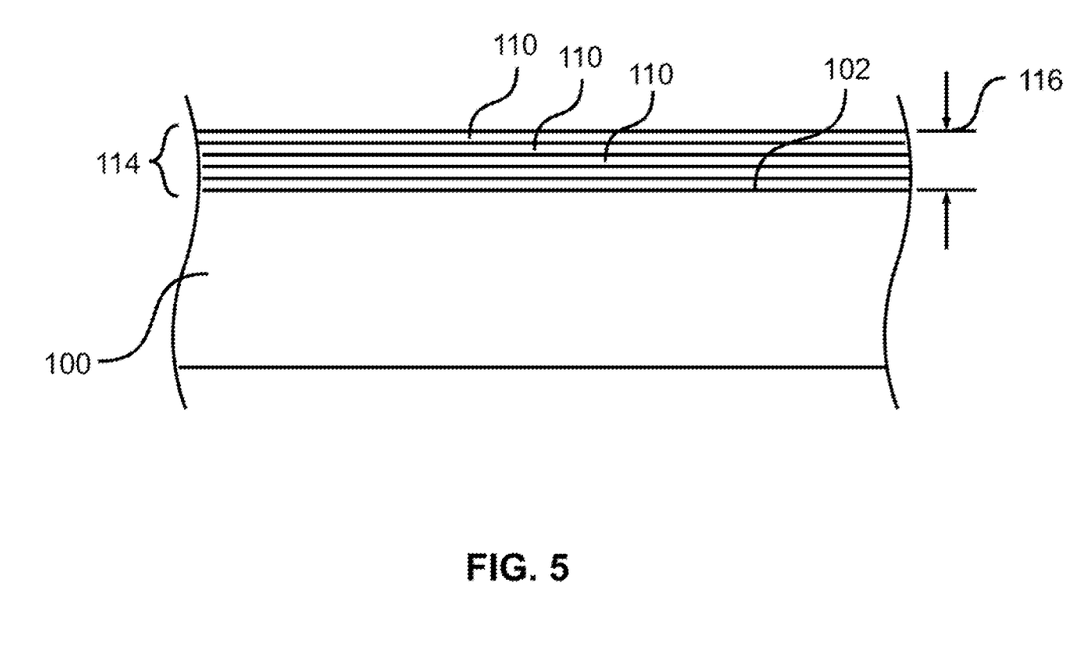
FIG. 5 is a cross-sectional view of the substrate of FIG. 4 after additional oxide mono-layers have been formed thereon.

Referring now to FIG. 5, the reaction cycle described above may be repeated (perhaps dozens, or even hundreds, of times) so that a stack of mono-layers 110 is formed above the substrate 100 (with a new mono-layer 110 being formed during each cycle). As a result, the mono-layers 110 jointly form a high-k dielectric layer 114 having a thickness 116 of, for example, between about 0.2 nm and about 10 nm, depending on the number of reaction cycles performed. In some embodiments, after the high-k dielectric layer 114 is formed, an annealing process is performed, such in an oxygen gas environment at temperatures less than 600° C.

Because each of the mono-layers 110 includes both hafnium oxide and zirconium oxide, the hafnium oxide and the zirconium oxide may be substantially evenly distributed throughout the thickness 116 of the high-k dielectric layer 114 (as opposed to having some mono-layers only including hafnium oxide and other mono-layers only including zirconium oxide). However, as described above, the amount of zirconium oxide (and/or hafnium oxide) in each mono-layer 110 may be adjusted by changing the number of precursor pulses applied.

Figure 6:
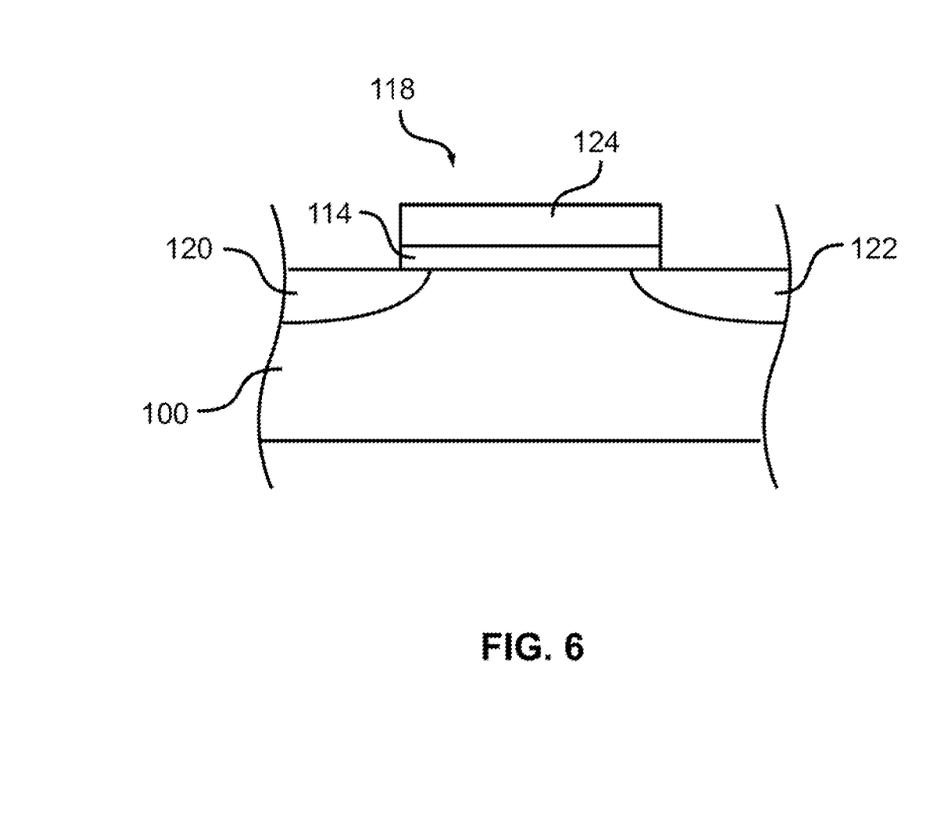
FIG. 6 is a semiconductor device according to some embodiments.

In some embodiments, the high-k dielectric layer 114 may be incorporated into a semiconductor device, such as metal-oxide-semiconductor field-effect transistor (MOSFET) 118 shown in FIG. 6. As shown, the high-k dielectric layer 114 is used as a high-k gate dielectric in the MOSFET 118. In the depicted embodiment, the MOSFET 118 also includes a source region 120 and a drain region 122 formed in the substrate 100, as well as a gate electrode 124 formed above the gate dielectric 114. As shown, the source region 120, the drain region 122, and the gate dielectric 114 are arranged such that the ends of the gate dielectric at least partially extend over the source region 120 and the drain region 122.

When dielectric material described above (e.g., the zirconium-doped hafnium oxide) is used in a gate dielectric for a semiconductor device, such as the MOSFET 118 shown in FIG. 6, both the negative-bias temperature instability (NBTI) and the positive-bias temperature instability (PBTI) of the device are improved. At the same time, the gate leakage of the device is not significantly increased, which may be particularly desirable for low power applications.

Figure 7:
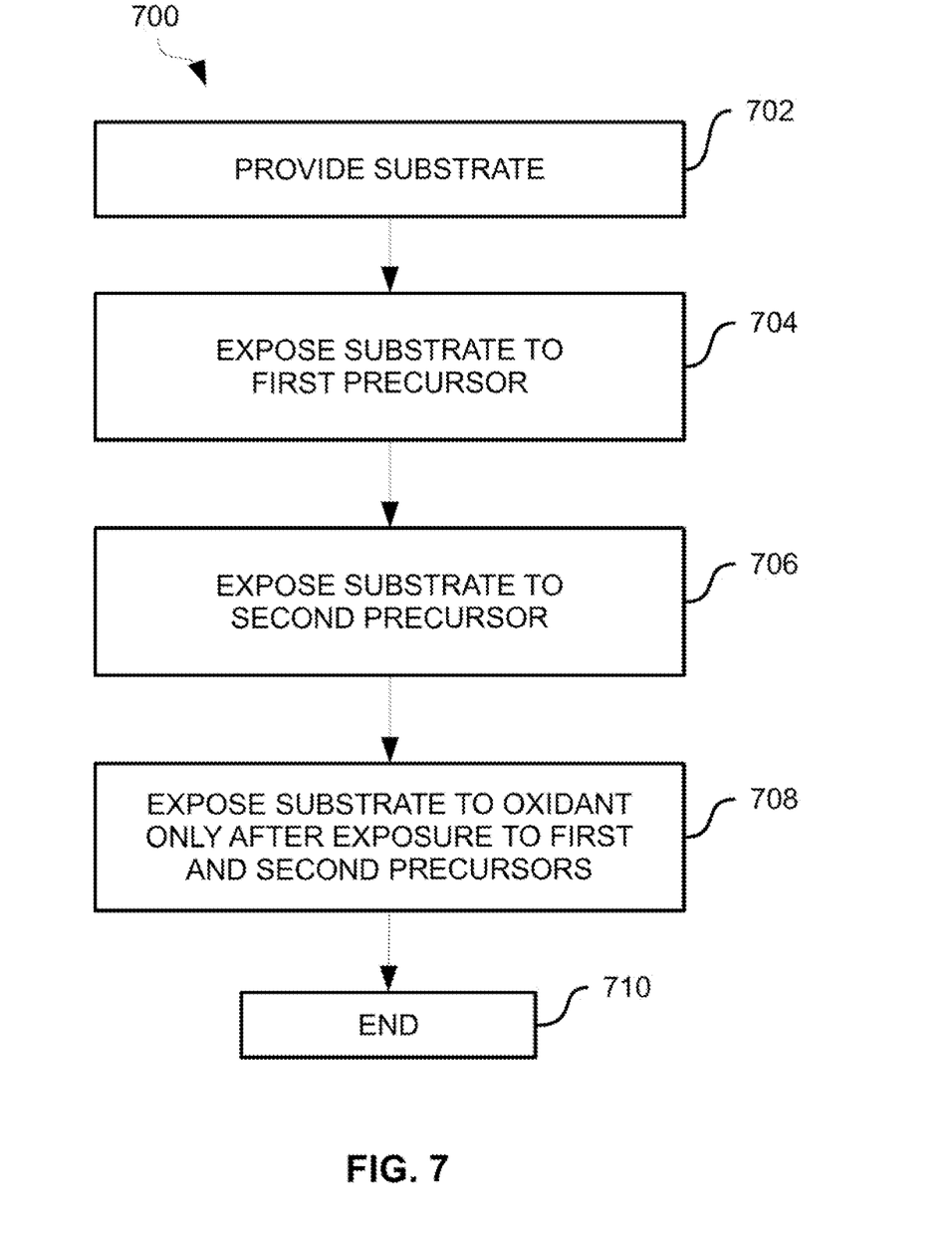
FIG. 7 is flow chart of a method for forming a high-k dielectric layer according to some embodiments.

FIG. 7 illustrates a method 700 for forming a high-k dielectric according to some embodiments. At block 702, the method 700 begins by providing a substrate, such as the semiconductor substrate described above. In some embodiments, the substrate includes a dielectric layer (e.g., silicon oxide) formed at the upper surface thereof. However, in some embodiments, the dielectric layer is formed above the substrate at block 702 (e.g., using CVD).

At block 704, the substrate (or the dielectric layer) is exposed to a first precursor (or reagent). The first precursor may be a hafnium precursor or a zirconium precursor and causes the respective atoms to become bonded to the surface of the substrate, which do not occupy all of the surface sites on the substrate. After being exposed to the first precursor, the substrate may be exposed to a purge gas, such as argon or nitrogen.

At block 706, the substrate is exposed to a second precursor. In some embodiments in which the first precursor is a hafnium precursor, the second precursor is a zirconium precursor, and vice versa. The exposure to the second precursor causes atoms from the second precursor (e.g., zirconium atoms) to be bonded to at least some of the sites of the surface of the substrate which remained vacant after exposure to the first precursor. After being exposed to the second precursor, the substrate may again be exposed to a purge gas.

At block 708, the substrate is exposed to an oxidant, such as water vapor. The exposure of the substrate to the oxidant causes the atoms (e.g., hafnium and zirconium atoms) to become oxidized, resulting in a oxide mono-layer (e.g., zirconium-doped hafnium oxide) being formed above the substrate. It should be noted that in at least some embodiments, the substrate is not exposed to the oxidant until after the substrate has been exposed to both the first precursor and the second precursor.

Although not specifically shown, in some embodiments, blocks 704, 706, and 708 are repeated such that a stack of multiple oxide mono-layers are formed above the substrate. At block 710, the method 700 ends.

Figure 8:
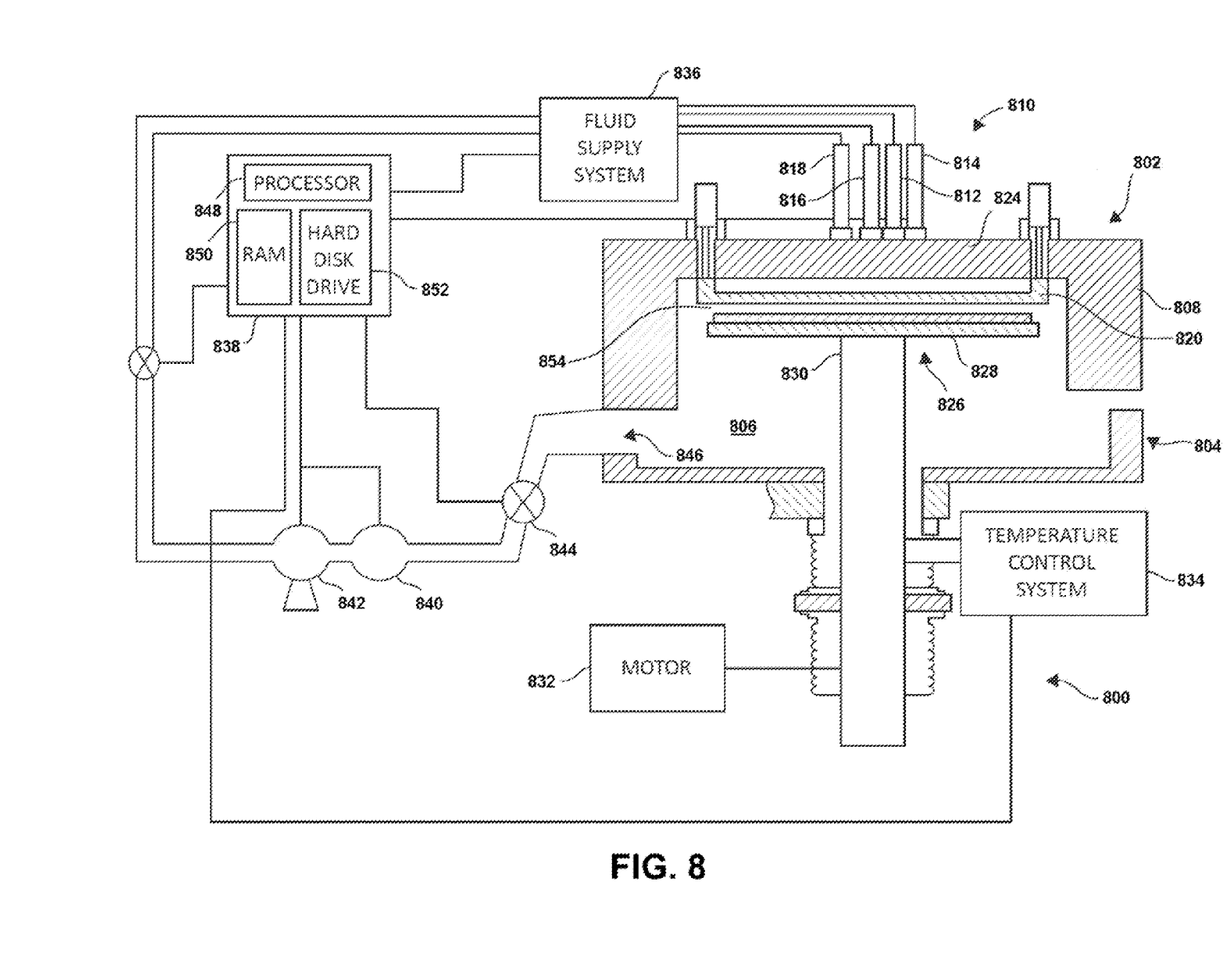
FIG. 8 is a cross-sectional view of an atomic layer deposition (ALD) processing system according to some embodiments.

FIG. 8 illustrates a processing system (e.g., an ALD processing system) according to some embodiments, which may be used to form the high-k dielectric layer(s) described above. The system 800 includes an enclosure assembly 802 formed from a process-compatible material, such as aluminum or anodized aluminum. The enclosure assembly 802 includes a housing 804, which defines a processing chamber 806, and a vacuum lid assembly 808 covering an opening to the processing chamber 806 at an upper end thereof. Although only shown in cross-section, it should be understood that the processing chamber 806 is enclosed on all sides by the housing 804 and/or the vacuum lid assembly 808.

A process fluid injection assembly 810 is mounted to the vacuum lid assembly 808 and includes a plurality of passageways (or injection ports) 812, 814, 816, and 818 and a showerhead 820 to deliver reactive and carrier fluids into the processing chamber 806. In the embodiment depicted in FIG. 8, the showerhead 820 is moveably coupled to an upper portion of the vacuum lid assembly 808 (i.e., a backing plate 824). The showerhead 820 may be formed from any known material suitable for the application, including stainless steel, aluminum, anodized aluminum, nickel, ceramics and the like.

Referring again to FIG. 8, the system 800 also includes a heater/lift assembly 826 disposed within processing chamber 806. The heater/lift assembly 826 includes a support pedestal (or substrate support) 828 connected to an upper portion of a support shaft 830. The support pedestal 828 is positioned between shaft 830 and the backing plate 824 and may be formed from any process-compatible material, including aluminum nitride and aluminum oxide ($Al_2O_3$ or alumina). The support pedestal 828 is configured to hold or support a substrate and may be a vacuum chuck, as is commonly understood, or utilize other conventional techniques, such as an electrostatic chuck (ESC) or physical clamping mechanisms, to prevent the substrate from moving on the support pedestal 828. The support shaft 830 is moveably coupled to the housing 804 so as to vary the distance between support pedestal 828 and the backing plate 824. That is, the support shaft 830 may be vertically moved to vary the distance between the support pedestal 828 and the backing plate 824. In the depicted embodiment, a lower portion of the support shaft 830 is coupled to a motor 832 which is configured to perform this movement. Although not shown, a sensor may provide information concerning the position of the support pedestal 828 within processing chamber 806.

The support pedestal 828 may be used to heat the substrate through the use of heating elements (not shown) such as resistive heating elements embedded in the pedestal assembly. In the embodiment shown in FIG. 8, a temperature control system 834 is provided to control the heating elements, as well as maintain the chamber housing 804, vacuum lid assembly 808, and showerhead 820 within desired temperature ranges in a conventional manner.

Still referring to FIG. 8, the system 800 also includes a fluid supply system 836 and a controller (or system control system) 838. The fluid supply system 836 is in fluid communication with the passageways 812, 814, 816, and 818 through a sequence of conduits (or fluid lines).

The fluid supply system 836 (and/or the controller 70) controls the flow of processing fluids to, from, and within the processing chamber 806 are with a pressure control system that includes, in the embodiment shown, a turbo pump 840 and a roughing pump 842. The turbo pump 840 and the roughing pump 842 are in fluid communication with processing chamber 806 via a butterfly valve 844 and a pump channel 846.

The controller 838 includes a processor 848 and memory, such as random access memory (RAM) 850 and a hard disk drive 852. The controller 838 is in operable communication with the various other components of the processing system 800, including the turbo pump 840, the temperature control system 834, the fluid supply system 836, and the motor 832 and controls the operation of the entire processing system to perform the methods and processes described herein.

During operation, the system 800 establishes conditions in a processing region 854 between an upper surface of the substrate and the showerhead 820, such as injecting precursors (or reagents), as well as purge gases, to form the desired material on the surface of the substrate.

Thus, in some embodiments, a method for forming a high-k dielectric layer is provided. A substrate is provided. The substrate includes a semiconductor material and a dielectric layer (e.g., silicon oxide) formed above the semiconductor material. The substrate is exposed to a hafnium precursor. The substrate is exposed to a zirconium precursor. The substrate is exposed to an oxidant only after the exposing of the substrate to the hafnium precursor and the exposing of the substrate to the zirconium precursor. The exposing of the substrate to the hafnium precursor, the exposing of the substrate to the zirconium precursor, and the exposing of the substrate to the oxidant causes a layer to be formed over the substrate. The layer includes hafnium, zirconium, and oxygen.

In some embodiments, a method for forming a high-k dielectric layer is provided. A substrate is provided. The substrate includes a semiconductor material and a dielectric layer (e.g., silicon oxide) formed above the semiconductor material. A plurality of ALD reaction cycles are performed on the substrate. Each ALD reaction cycle includes exposing the substrate to a first ALD precursor, exposing the substrate to a second ALD precursor after the exposing of the substrate to the first ALD precursor, and exposing the substrate to an oxidant only after the exposing of the substrate to the second ALD precursor. One of the first ALD precursor and the second ALD precursor is a hafnium precursor, and the other of the first ALD precursor and the second ALD precursor is a zirconium precursor. The performing of the plurality of ALD reaction cycles on the substrate causes a layer to be formed above the substrate. The layer includes hafnium, zirconium, and oxygen.

In some embodiments, a semiconductor device is provided. The semiconductor device includes a substrate having a semiconductor material and a dielectric layer (e.g., silicon oxide) formed above the semiconductor material. A high-k dielectric layer is formed above the substrate. The high-k dielectric layer has a thickness and includes hafnium, zirconium, and oxygen. At least one of the hafnium and the zirconium is substantially evenly distributed throughout the thickness of the high-k dielectric layer.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a high-k gate dielectric layer, the method comprising:
    providing a substrate, the substrate comprising a semiconductor material and a silicon oxide layer formed above the semiconductor material;
    exposing the substrate to a hafnium precursor;
    after the exposing of the substrate to the hafnium precursor, exposing the substrate to a zirconium precursor; and
    after an initiation of the exposing of the substrate to the hafnium precursor, exposing the substrate to an oxidant only after the exposing of the substrate to the hafnium precursor and the exposing of the substrate to the zirconium precursor.

2. The method of claim 1, wherein the exposing of the substrate to the zirconium precursor occurs after the exposing of the substrate to the hafnium precursor.

3. The method of claim 2, wherein the exposing of the substrate to the hafnium precursor, the exposing of the substrate to the zirconium precursor, and the exposing of the substrate to the oxidant causes a zirconium-doped hafnium oxide layer to be formed above the substrate.

4. The method of claim 3, wherein the hafnium precursor comprises tetrakisdimethyl amido hafnium (TDMAHf), tetrakis-diethyl amido hafnium (TDEAHf), hafnium tert-butoxide, hafnium chloride, or a combination thereof.

5. The method of claim 4, wherein the zirconium precursor comprises tetrakis-diethyl amido zirconium (TDEAZr).

6. The method of claim 2, further comprising re-exposing the substrate to the hafnium precursor after the exposing of the substrate to the hafnium precursor and before the exposing of the substrate to the zirconium precursor.

7. The method of claim 2, further comprising:
    exposing the substrate to a first purge gas after the exposing of the substrate to the hafnium precursor and before the exposing of the substrate to the zirconium precursor; and
    exposing the substrate to a second purge gas after the exposing of the substrate to the zirconium precursor and before the exposing of the substrate to the oxidant.

8. The method of claim 1, wherein the exposing of the substrate to the hafnium precursor, the exposing of the substrate to the zirconium precursor, and the exposing of the substrate to the oxidant jointly perform an atomic layer deposition (ALD) cycle, and further comprising repeating the ALD cycle.

9. The method of claim 1, wherein the semiconductor material comprises silicon, germanium, gallium arsenide, or a combination thereof.

10. The method of claim 1, wherein the exposing of the substrate to the hafnium precursor occurs after the exposing of the substrate to the zirconium precursor, and wherein the layer comprises hafnium-doped zirconium oxide.

11. A method for forming a high-k gate dielectric layer, the method comprising:
    providing a substrate, the substrate comprising a semiconductor material and a silicon oxide layer formed above the semiconductor material;
    performing a plurality of atomic layer deposition (ALD) reaction cycles on the substrate, wherein each ALD reaction cycle comprises:
        exposing the substrate to a first ALD precursor, wherein the first ALD precursor is a hafnium precursor;
        exposing the substrate to a second ALD precursor after the exposing of the substrate to the first ALD precursor, wherein the second ALD precursor is a zirconium precursor; and
        exposing the substrate to an oxidant only after the exposing of the substrate to the second ALD precursor,
    wherein the hafnium precursor comprises tetrakisdimethyl amido hafnium (TDMAHf), tetrakis-diethyl amido hafnium (TDEAHf), hafnium tert-butoxide, hafnium chloride, or a combination thereof;
    wherein the zirconium precursor comprises tetrakis-diethyl amido zirconium (TDEAZr); and
    wherein the performing of the plurality of ALD reaction cycles on the substrate causes a layer to be formed above the substrate, the layer comprising hafnium, zirconium, and oxygen.

* * * * *